United States Patent
Luo et al.

(10) Patent No.: US 8,241,519 B2
(45) Date of Patent: Aug. 14, 2012

(54) RELAXOR-PT FERROELECTRIC SINGLE CRYSTALS

(75) Inventors: Jun Luo, State College, PA (US); Wesley S. Hackenberger, State College, PA (US); Shujun Zhang, State College, PA (US); Richard J. Meyer, Jr., State College, PA (US); Thomas R. Shrout, Pennsylvania Furnace, PA (US); Nevin P. Sherlock, Port Matilda, PA (US)

(73) Assignees: TRS Technologies, Inc., State College, PA (US); Penn State Research Foundation, University Park, PA (US)

( * ) Notice: Subject to any disclaimer, the term of this patent is extended or adjusted under 35 U.S.C. 154(b) by 0 days.

(21) Appl. No.: 12/724,832

(22) Filed: Mar. 16, 2010

(65) Prior Publication Data

US 2011/0017937 A1 Jan. 27, 2011

Related U.S. Application Data

(60) Provisional application No. 61/160,878, filed on Mar. 17, 2009.

(51) Int. Cl.
  *C04B 35/00* (2006.01)
  *H01L 41/18* (2006.01)
  *H01L 41/00* (2006.01)

(52) U.S. Cl. ............ 252/62.9 PZ; 252/62.9 R; 310/358

(58) Field of Classification Search ............ 252/62.9 R, 252/62.9 PZ; 310/357, 358; 501/134; 117/81, 117/83

See application file for complete search history.

(56) References Cited

U.S. PATENT DOCUMENTS

| 4,313,839 | A | 2/1982 | Fesenko et al. |
| 5,998,910 | A | 12/1999 | Park et al. |
| 6,156,259 | A | 12/2000 | Nishizawa et al. |
| 6,899,761 | B2 * | 5/2005 | Eissler ............ 117/83 |
| 2002/0193237 | A1 | 12/2002 | Messing et al. |
| 2006/0091353 | A1 * | 5/2006 | Matsushita et al. ...... 252/62.9 R |
| 2007/0034141 | A1 * | 2/2007 | Han ............ 117/81 |
| 2007/0090728 | A1 * | 4/2007 | Matsuda et al. ............ 310/358 |
| 2007/0267947 | A1 * | 11/2007 | Matsushita et al. ......... 310/358 |
| 2009/0194732 | A1 * | 8/2009 | Luo et al. ............ 252/62.9 PZ |
| 2012/0037839 | A1 * | 2/2012 | Hackenberger et al. ..... 252/62.9 PZ |

FOREIGN PATENT DOCUMENTS

EP  1755177 A1  2/2007
WO  2009134484 A2  11/2009

OTHER PUBLICATIONS

Luo et al., "Effects of Mn doping on dielectric and piezoelectric properties of 0.71Pb(Mg1/3Nb1/3)O3—0.29PbTiO3 single crystals", Applied Physics Letters, vol. 90, Mar. 2007, pp. 102907-1 to 102907-3.*
Park Jong-Sung, et al, "The effect of alkali niobate addition on the phase stability and dielectric properties of Pb(Zn1/3Nb2/3)O3 based ceramic", Journal of Applied Physics, New York, US, vol. 101, No. 11, Jun. 1, 2007 pp. 114101-114101.
Park John-Sung, et al., "Ferroelectric properties of Pb(Zn1/3Nb2/3)O3—PbTiO3—RNbO3 (R=Na, K) ceramics", Jounal of the American Ceramic Society USA LNKD-DOI: 10.1111/J.1551-2916.2007.01917, vol. 90, No. 11, Nov. 2007, pp. 3512-3516.
Zhang, S., et al., "Growth and electrical properties of (Mn, F) co-doped 0.92Pb(Zn1/3Nb2/3)O3—0.08PbTiO3 single crystal", Journal of Crystal Growth, Elsevier, Amsterdam, NL LNKD-DOI:10.1016/J.JCRYSGRO.204.03.063, vol. 267, No. 1-2, Jun. 15, 2004, pp. 204-212.

* cited by examiner

*Primary Examiner* — Emily Le
*Assistant Examiner* — Lynne Edmondson
(74) *Attorney, Agent, or Firm* — McNees Wallace & Nurick LLC

(57) ABSTRACT

A <110> domain engineered relaxor-PT single crystals having a dielectric loss of about 0.2%, a high electromechanical coupling factor greater than about 85%, and high mechanical quality factor greater than about 500 is disclosed. In one embodiment, the relaxor-PT material has the general formula, $Pb(B_1B_2)O_3$—$Pb(B_3)O_3$, where $B_1$ may be one ion or combination of $Mg^{2+}$, $Zn^{2+}$, $Ni^{2+}$, $Sc^{3+}$, $In^{3+}$, $Yb^{3+}$, $B_2$ may be one ion or combination of $Nb^{5+}$, $Ta^{5+}$, $W^{6+}$, and $B_3$ may be $Ti^{4+}$ or combination of $Ti^{4+}$ with $Zr^{4+}$ and/or $Hf^{4+}$.

14 Claims, No Drawings

“RELAXOR-PT FERROELECTRIC SINGLE CRYSTALS”

RELAXOR-PT FERROELECTRIC SINGLE CRYSTALS

CROSS-REFERENCE TO RELATED APPLICATIONS

This application claims priority to U.S. Provisional Patent Application No. 61/160,878 filed on Mar. 17, 2009, entitled "RELAXOR-PT FERROELECTRIC SINGLE CRYSTALS" which is herein incorporated by reference in its entirety.

STATEMENT OF FEDERALLY SPONSORED RESEARCH

Portions of the invention disclosed herein were reduced to practice with the support of the U.S. Office of Naval Research, Grant No. 00014-07-C-0761. The U.S. Government may have certain rights in this invention.

FIELD

The present invention is generally directed to ferroelectric single crystals, and more particularly to relaxor-PT based ferroelectric single crystals.

BACKGROUND

Ferroelectric ceramics are currently the material of choice for ultrasonic transducer applications. These materials offer electromechanical coupling factors ($k_{ij}$) in a range between about 60% and about 70% and a wide range of dielectric constants (K). These characteristics translate into transducer performance in the form of relatively high sensitivity and broad bandwidth.

One example of a ferroelectric ceramic is lead zirconate titanate ($Pb(Zr_{1-x}Ti_x)O_3$, also called PZT. PZT is a ceramic perovskite material that shows a marked piezoelectric effect. Currently, PZT ceramics are the mainstay for high performance transducer applications. PZT ceramic compositions lie near the morphotropic phase boundary (MPB) between the tetragonal and rhombohedral phases. These PZT ceramics have anomalously high dielectric and piezoelectric properties as a result of enhanced polarizability arising from coupling between two equivalent energy states, i.e. the tetragonal and rhombohedral phases, allowing optimum domain reorientation during the poling process. PZT ceramics may be modified using acceptor dopants to form acceptor modified PZT ceramics having a high mechanical quality factor Q.

Acceptor modified PZT ceramics, such as DOD Type I & III piezoelectric ceramics, are often used in high power applications. These materials exhibit hard ferroelectric characteristics, or in other words, have a mechanical quality factor Q (inverse of mechanical loss) in the range of about 500 to about 1500 and a dielectric loss of about 0.4%. However, these materials also have a low dielectric permittivity in the range of about 1000 to about 1500 and low electromechanical coupling factors, $k_{33}$, of less than 70%.

Alternative MPB systems are relaxor-based ferroelectrics include their solid solutions with $PbTiO_3$ (PT). In these relaxor-based ferroelectrics, the transition between piezoelectric behavior and loss of piezoelectric capability does not occur below a specific temperature (for example, the Curie point for PZT ceramics), but instead occurs over a temperature range. These lead based relaxor materials exhibit a complex perovskite-type crystal structure with the general formula $Pb(B_1B_2)O_3$, where $B_1$ may be selected from the group including $Mg^{2+}$, $Zn^{2+}$, $Ni^{2+}$, $Sc^{3+}$, $In^{3+}$, $Yb^{3+}$, and $B_2$ may be selected from the group including $Nb^{5+}$, $Ta^{5+}$, and $W^{6+}$, and have compositions that lie near an MPB. These relaxor-PT ceramics can be formulated to have superior dielectric and piezoelectric properties compared to most PZT ceramics it is usually done at the expense of temperature stability. If analyzed with respect to the ferroelectric transition temperature (the temperature at which the material transforms from the prototypical non-ferroelectric to ferroelectric phase being associated with a spontaneous polarization and large dielectric anomaly), no one type of ceramic, relaxor-PT or PZT, offers significant advantages in overall performance.

Though relaxor-PT ceramics do not offer enhanced dielectric and piezoelectric properties comparable to PZT ceramics of similar transition temperatures, it is the single crystal form of relaxor-PT ceramics that exhibit ultrahigh piezoelectric properties not currently available with piezoelectric MPB ceramics. Relaxor-PT single crystals, such as $Pb(Zn_{1/3}Nb_{2/3})O_3$—$PbTiO_3$ (PZNT) and $Pb(Mg_{1/3}Nb_{2/3})O_3$—$PbTiO_3$ (PMNT), have excellent properties in the <001> poled orientation. These relaxor-PT single crystals have high piezoelectric coefficients $d_{33}$ in the range of greater than 1500 pC/N and large dielectric permittivity $\in_r$ in the range of about 5,000 to about 7,000, due to a ferroelectric domain engineered configuration in the material. However, these materials also have a relatively low mechanical quality factor (Q) of less than about 100. The combination of high piezoelectric properties and low Q makes relaxor-PT single crystals attractive for non-resonant actuators and high frequency medical ultrasound transducer applications. However, these characteristics are not desirable for high power applications, such as medical ultrasonic and high duty cycle sonar transducers, which require a transducer having a high mechanical quality factor (Q) in order to reduce heat generation. Medical ultrasonic applications may include high intensity focused ultrasound (HIFU) and ultra sound-guided HIFU therapy, which require transducers capable of both high quality diagnostic imaging and radiating high acoustic power into tissue.

Therefore, there is a need for a ferroelectric single crystal having a high dielectric permittivity and high electromechanical coupling factor ($k_{ij}$) to improve sensitivity and bandwidth, and having a high mechanical quality factor (Q) to meet the requirement of delivering higher power.

DETAILED DESCRIPTION OF EXEMPLARY EMBODIMENTS

This disclosure provides for a piezoelectric single crystal material having a high dielectric permittivity ($\in$), a high electromechanical coupling factor ($k_{ij}$), a high piezoelectric coefficient ($d_{ij}$), and high mechanical quality factor (Q). This disclosure further provides for a piezoelectric single crystal material having a high figure of merit (FOM) for high power applications, which is the product of piezoelectric coefficient (d) and mechanical (Q).

The present disclosure provides for relaxor-based single crystals having these desired characteristics by providing specific domain oriented relaxor-PT single crystals.

In one embodiment, a domain engineered relaxor-PT single crystal having a <110> orientation was provided. This <110> oriented relaxor-PT single crystal had a high mechanical Q and a low dielectric loss, or in other words, exhibited a "hardening" effect. The <110> oriented relaxor-PT based single crystals may be used in high power applications, like acoustic radiation force impulse (ARFI) imaging and ultrasound-guided HIFU therapy (probes), ultrasonic motors, piezoelectric transformers, and underwater sonar transducers. In one embodiment, the <110> oriented relaxor-PT single crystals are oriented in a longitudinal or $d_{33}$-mode. The <110> oriented relaxor-PT single crystals have a rhombohedral or mixed phase below or proximate the morphotropic phase boundary. As understood herein, below or proximate to the morphotropic phase boundary is understood to mean where the composition exhibits high electromechanical properties.

In one embodiment, relaxor-PT based single crystals are disclosed having a general formulation of $Pb(B_1B_2)O_3$—$Pb(B_3)O_3$, where $B_1$ may be one ion or combination of $Mg^{2+}$, $Zn^{2+}$, $Ni^{2+}$, $Sc^{3+}$, $In^{3+}$, $Yb^{3+}$, $B_2$ may be one ion or combination of $Nb^{5+}$, $Ta^{5+}$, $W^{6+}$, and $B_3$ may be $Ti^{4+}$ or combination of $Ti^{4+}$ with $Zr^{4+}$ and/or $Hf^{4+}$. For example, the relaxor-PT based single crystals may be $(1-x)Pb(Mg_{1/3}Nb_{2/3})O_3$-$xPb$-$TiO_3$ (PMNT) (24%<x<35) or $xPb(In_{1/2}Nb_{1/2})O_3$—$(1-x-y)Pb(Mg_{1/3}Nb_{2/3})O_3$-$yPbTiO_3$ (PIN-PMN-PT) (15%<x<40% and 24%<y<35%) single crystals, with rhombohedral phase or MPB compositions. The $Pb(B_1B_2)O_3$—$Pb(B_3)O_3$ single crystals may be doped with acceptor ions, such as $Mn^{2+,3+}$, $Ni^{3+}$, $Co^{2+,3+}$, $Al^{3+}$, $K^+$, $Na^+$, $F^-$ or mixture thereof.

The relaxor-PT single crystals of the present disclosure have a mechanical Q greater than about 500, a dielectric loss of about 0.1 to about 0.5%, and a electromechanical coupling factor $k_{33}$ of greater than about 85%. In another embodiment, the relaxor-PT single crystals of the present disclosure have a mechanical Q of about 500 to about 1500, a dielectric loss of about 0.1 to about 0.5%, and a electromechanical coupling factor $k_{33}$ of about 85% to about 95%. While not intending to be held to a particular scientific explanation, it is believed that the strong anisotropic behavior of the <110> single crystals is due to the engineered domain patterns. The <110> oriented crystals exhibited a macroscopic mm2 symmetry as compared to a 4 mm symmetry for a <001> poled crystal.

The relaxor-PT single crystals of the present disclosure may be formed from a novel melt using the Vertical Bridgeman method. In one embodiment, the relaxor-PT single crystals of the present disclosure are formed by the process disclosed in co-owned U.S. patent application Ser. No. 12/023, 646, filed Jan. 31, 2008, entitled "METHOD OF MAKING TERNARY PIEZOELECTRIC CRYSTALS", which is incorporated herein by its entirety. These single crystals have improved Curie temperatures, $T_c$, and improved rhombohedral to tetragonal phase transition temperatures, $T_{rt}$ that allows the single crystals to be used at higher temperatures. This is critical for applications that require high power transmission but in which there is little space and in which cooling capacity is limited, so that operational temperatures are important to control.

In order to compare relaxor-PT single crystals according to the disclosure to a <001> single crystal orientation, PMN-30% PT, PMN-26% PT, 28% PIN-PMN-30% PT, and 28% PIN-PMN-26% PT relaxor-PT sample single crystals were oriented along the crystallographic directions <001> and <110> and cut into longitudinal bars with aspect ratio to provide for a longitudinal mode according to IEEE standards on piezoelectricity (ANSI-IEEE 176-1987). The samples were electroded by sputtering a thin film of gold and poled at an electric field of about 5 to about 20 kV/cm and in the temperature range of about 25° C. to about 150° C. for about three to thirty minutes. In order to minimize stress effects on the samples during the measurement, fine silver wires were glued to the samples with silver paint. The samples were aged for about 24 hours prior to the measurements. The capacitance and dielectric loss of the samples were measured using an HP4284A multi-frequency LCR meter, from which the dielectric permittivity was calculated. The resonance and anti-resonance frequencies were measured by an HP4294A Impedance-phase gain analyzer, from which, the electromechanical coupling factor ($k_{33}$), mechanical quality factor ($Q_{33}$) and piezoelectric coefficient ($d_{33}$) were calculated according to IEEE standards (ANSI-IEEE 176-1987).

Table I lists the main longitudinal properties along <001> and <110> orientations for the sample <001> and <110> single crystals. For the samples poled along the <001> orientation, the piezoelectric coefficient $d_{33}$ was found to be approximately 1500 pC/N, and the electromechanical coupling factor $k_{33}$ was greater than about 90%. However, the mechanical $Q_{33}$ for these samples was low, or approximately between about 100 and about 120.

TABLE I

The longitudinal properties of PMNT/PIN-PMN-PT single crystals along <001> and <110> orientations.

| Material | | K | loss | $k_{33}$ | $d_{33}$ (pC/N) | $Q_{33}$ | $d_{33}Q_{33}$ |
|---|---|---|---|---|---|---|---|
| PMNT30 | <001> | 5200 | 0.4% | 0.900 | 1500 | 100 | $1.5 \times 10^5$ |
|  | <110> | 4400 | 0.2% | 0.895 | 1050 | 600 | $6.3 \times 10^5$ |
| PMNT26 | <110> | 3320 | 0.2% | 0.876 | 820 | 850 | $7 \times 10^5$ |
| PIN-PMN-PT (30% PT) | <001> | 4400 | 0.4% | 0.920 | 1500 | 120 | $1.8 \times 10^5$ |
|  | <110> | 3400 | 0.2% | 0.905 | 925 | 500 | $4.6 \times 10^5$ |
| PIN-PMN-PT (26% PT) | <110> | 2650 | 0.2% | 0.850 | 690 | 1000 | $6.9 \times 10^5$ |

However, while it was found that the <110> domain engineered ferroelectric single crystals had piezoelectric properties ($k_{33}$ of approximately 90% and $d_{33}$ of approximately 1000 pC/N) comparable to the <001> samples, the <110> samples unexpectedly exhibited a much higher mechanical Q of greater than about 500 and a much lower dielectric loss of about 0.2%. While not intending to be held to a particular scientific explanation, it is believed that the strong anisotropic behavior of the <110> single crystals was due to the different engineered domain patterns. The <110> oriented crystals exhibited a macroscopic mm2 symmetry as compared to a 4 mm symmetry for the <001> poled crystal.

Furthermore, the figure of merit (FOM) or $d_{33}Q_{33}$ for the <110> oriented crystals was much higher than the value obtained from <001> oriented crystals. Additionally, as can be seen from Table I, when the PT content in the single crystals decrease, which moves the composition away from the morphotropic phase boundary, the piezoelectric activity is reduced, while the mechanical Q increased to about 1000.

In another embodiment, other resonance modes (transverse, shear, radial, hoop, thickness, etc.) exist which may benefit from use of <110> oriented material for high power applications.

In another test, the results of which are not provided herein, samples in the crystallographic direction <111> resulted in low piezoelectric response of about 100 pC/N and a high mechanical Q greater than about 1000. This is believed to be due to the single domain pattern of the <111> single crystal.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A transducer comprising:
single crystals of a relaxor-PT material of the formula $xPb(In_{1/2}Nb_{1/2})O_3$—$(1-x-y)Pb(Mg_{1/3}Nb_{2/3})O_3$-$yPbTiO_3$ (PIN-PMN-PT) (15%<x<40% and 24%<y<35%) having a <110> orientation and having a rhombohedral or mixed phase below or proximate the morphotropic phase boundary, wherein the single crystals are doped with $Mn^{2+}$, $Mn^{3+}$ or mixtures thereof.

2. The transducer of claim 1, wherein the single crystals of a relaxor-PT material are oriented in a <110> longitudinal mode.

3. The transducer of claim 1, wherein the single crystals have a mechanical quality factor greater than about 500.

4. The transducer of claim 1, wherein the single crystals have a electromechanical coupling factor greater than about 85%.

5. The transducer of claim 1, wherein the single crystals have a dielectric loss of about 0.1 to about 0.5%.

6. A ferroelectric material, comprising:
single crystals of a relaxor-PT material of the formula $xPb(In_{1/2}Nb_{1/2})O_3$—$(1-x-y)Pb(Mg_{1/3}Nb_{2/3})O_3$-$yPbTiO_3$ (PIN-PMN-PT) (15%<x<40% and 24%<y<35%) having a <110> orientation and having a rhombohedral or mixed phase material below or proximate the morphotropic phase boundary, wherein the single crystals are doped with $Mn^{2+}$, $Mn^{3+}$ or mixtures thereof.

7. The ferroelectric material of claim 6, wherein the single crystals of a relaxor-PT material are oriented in a <110> longitudinal mode.

8. The ferroelectric material of claim 6, wherein the ferroelectric single crystal has a mechanical quality factor greater than about 500.

9. The ferroelectric material of claim 6, wherein the ferroelectric single crystal has an electromechanical coupling factor greater than about 85%.

10. A method of forming a piezoelectric resonator, comprising:
forming a relaxor-PT based ferroelectric single crystal of the formula $xPb(In_{1/2}Nb_{1/2})O_3$—$(1-x-y)Pb(Mg_{1/3}Nb_{2/3})O_3$-$yPbTiO_3$ (PIN-PMN-PT) (15%<x<40% and 24%<y<35%) doped with $Mn^{2+}$, $Mn^{3+}$ or mixtures thereof; and
orienting the relaxor-PT based ferroelectric single crystal in a <110> orientation to obtain a relaxor-PT based ferroelectric single crystal having a mechanical quality factor greater than about 500.

11. The method of claim 10, wherein the oriented relaxor-PT based ferroelectric single crystal is oriented in a <110> longitudinal mode.

12. The method of claim 10, wherein the longitudinal mode relaxor-PT based ferroelectric single crystal is formed by a Vertical Bridgeman method.

13. The method of claim 10, wherein the relaxor-PT based ferroelectric crystal is formed in a longitudinal mode.

14. A ferroelectric material, comprising:
a single crystal of a relaxor-PT material of the formula $xPb(In_{1/2}Nb_{1/2})O_3$—$(1-x-y)Pb(Mg_{1/3}Nb_{2/3})O_3$-$yPbTiO_3$ (PIN-PMN-PT) (15%<x<40% and 24%<21y<35%) doped with $Mn^{2+}$, $Mn^{3+}$ or mixtures thereof and having a rhombohedral or mixed phase material below or proximate the morphotropic phase boundary, wherein the ferroelectric single crystal has a mechanical quality factor greater than about 500 and an electromechanical coupling factor greater than about 85%.

* * * * *